US010850441B2

(12) United States Patent
Sekhar

(10) Patent No.: US 10,850,441 B2
(45) Date of Patent: Dec. 1, 2020

(54) SURFACES HAVING TUNABLE ASPERITIES AND METHOD

(71) Applicant: Jainagesh Sekhar, Cincinnati, OH (US)

(72) Inventor: Jainagesh Sekhar, Cincinnati, OH (US)

(73) Assignee: MHI Health Devices, Inc., Cincinnati, OH (US)

( * ) Notice: Subject to any disclaimer, the term of this patent is extended or adjusted under 35 U.S.C. 154(b) by 10 days.

(21) Appl. No.: 16/242,118

(22) Filed: Jan. 8, 2019

(65) Prior Publication Data

US 2019/0210271 A1    Jul. 11, 2019

Related U.S. Application Data

(60) Provisional application No. 62/615,987, filed on Jan. 11, 2018, provisional application No. 62/625,374, filed on Feb. 2, 2018, provisional application No. 62/676,314, filed on May 25, 2018, provisional application No. 62/618,695, filed on Jan. 18, 2018.

(51) Int. Cl.
| | |
|---|---|
| *B21D 39/00* | (2006.01) |
| *B29C 59/14* | (2006.01) |
| *C23C 8/36* | (2006.01) |
| *C23C 16/02* | (2006.01) |
| *C23C 14/02* | (2006.01) |

(52) U.S. Cl.
CPC ............... *B29C 59/14* (2013.01); *C23C 8/36* (2013.01); *C23C 16/0245* (2013.01); *C23C 14/022* (2013.01)

(58) Field of Classification Search
None
See application file for complete search history.

(56) References Cited

U.S. PATENT DOCUMENTS

| 7,252,869 | B2 * | 8/2007 | Khusnatdinov | F41H 3/00 |
| | | | | 428/141 |
| 9,643,877 | B2 | 5/2017 | Sekhar | |
| 2011/0165382 | A1 * | 7/2011 | Gogolides | B29C 59/14 |
| | | | | 428/156 |
| 2015/0181685 | A1 * | 6/2015 | Sekhar | B23K 1/0056 |
| | | | | 427/569 |

(Continued)

OTHER PUBLICATIONS

Hariri et al., "n-Point Asperity Model for Contact Between Nominally Flat Surfaces", Jul. 2006, Journal of Tribology, vol. 128, p. 505-514. (Year: 2006).*

(Continued)

*Primary Examiner* — Seth Dumbris
*Assistant Examiner* — Kim S. Horger
(74) *Attorney, Agent, or Firm* — Michael Connelly

(57) ABSTRACT

This application present structures having surfaces with several multivariate and single property engineering applications that are associated with the surface and may be altered by the surface texture or tunable asperities themselves. Depending on the objective of the application, the tunable asperities address the energy requirement for an objective such as gripping or smooth-movement, as well as describes the critical conditions when slippage cannot be prevented. The use in several other energy intensive applications is also discussed as well as for solar, communication altering and color/hue manipulation objectives.

16 Claims, 6 Drawing Sheets

(56) References Cited

U.S. PATENT DOCUMENTS

2017/0347440 A1   11/2017   Sekhar

OTHER PUBLICATIONS

Bhushan et al., "Micro-, nano-, and hierarchical structures for superhydrophobicity, self-cleaning and low adhesion", 2009, Philosophical Transactions of The Royal Society A, vol. 367, p. 1631-1672. (Year: 2009).*
G. Yin, M. Song, W. Raja, P. Nadrae and M. Schmid; Experimental identification of unique angular dependent scattering behavior of nanoparticles. J Eur Opt Soc-Rapid-Publ 2017, 13:38 doi/10.1186/s41476-017-0066-4.
Flinn Scientific, Inc.,: Why Copper is Reddish in Color. Flinn Scientific Chem Fax, Publication No. 10307 061616, 2016 https://www.flinnsci.com/api/library/Download/485982234af046b491724d3736c93c51.

* cited by examiner

SURFACES HAVING TUNABLE ASPERITIES AND METHOD

CROSS REFERENCE TO RELATED APPLICATIONS

This patent application claims the benefit of provisional patents application Ser. No. 62/615,987, filed on Jan. 11, 2018, 62/446,880 filed on Jan. 17, 2017, 62/625,374 filed Feb. 2, 2018 and 62/676,314, filed on May 25, 2018 all by the present applicant, the disclosures of which are incorporated by reference herein in their entireties.

BACKGROUND

The twentieth century was a period for the discovery of new low-friction bulk materials, driven by a need to extend life and improve repeatability. Hard-materials, high modulus materials, solid and liquid lubricant materials, hard coatings and related manufacturing technologies were developed. Additionally, texture and fibril (a small or slender fiber) based surface engineering concepts became important. Surface smoothness and tolerances concepts gained importance as well. During the twentieth century, significant strides in experimental surface analysis were also made. Precise roughness values were obtained with devices such as the Atomic Force Microscope (0.7 nm asperity height and 100 nm waviness) or via optical methods (5 nm height and 200 nm wavelengths), stylus methods (10 nm height and 200 nm wavelength) and, sometimes, adsorption techniques.

One of the most important findings of this period was the improvement of stable low friction materials including graphite, graphene, composite borides of aluminum and magnesium, sulfides, PTFE Teflon and DLC (diamond like carbon materials made with composite materials which comprise both sp2 and sp3 bond components). It was also an era for the development of lubricants and other hard coatings following the successful use of carburizing as a method to increase the hardness of even quenched steel. New liquid and solid lubricant materials were developed, which reduced the effective coefficient of friction between mating surfaces, but also which prevented unintended scuffing. Lubricants served to reduce the coefficient of friction and to remove debris and heat. Increasingly, however, it was recognized that lubricants could be toxic, and excess-power was not always available for overcoming friction. Ecologically unhealthy conditions and high energy-use needed to be addressed.

Surface-science related friction concepts improved from force and surface energy considerations to a more texture-based understanding during this period. The importance of statistically important variations of the peak roughness like the RMS, $R_{KY}$ (Kurtosis the peakedness and curvature), $R_{skew}$ (Skewness or asymmetry) were also recognized for texture. These are related to the autocorrelation coefficient and root mean square/mean for random surfaces. The early understanding of texture-based analysis of friction was pioneered by Greenwood and Williamson (Greenwood J. A. and Williamson J. B. P.; Proc. R. Soc. Lond. A, 1966 295 and pursued by others.

Deformation and fracture mechanics-based understanding was used for the asperity interactions. Naturally, this understanding also led to the modification of equations used to further separate the normal force and the friction adhesion forces from the bonding potential between mating surfaces, especially when lubricants were employed. The bonding potential is larger than just surface tension and involves tangential contact-locks between asperities and nanoscale suction features from the texture. Notably, the study of bristles in applications such as tooth brushes to jet engine brush-seals became important. Control over the friction-force dominated objectives was found to be easily achieved by varying the normal force. In a paradoxical sense, the development of low friction materials led to the better understanding of friction instigated instabilities, further leading to bio-inspired studies, e.g., studies of the feet of cockroaches or for the role of asymmetry in texture referenced by the term autocorrelation length, $\beta$, the surface-texture anisotropy number $S_{tr}$, and other texture defining terms.

Surface texture was found to reveal specific diseases as texture imaging techniques could reveal the progression of disease. The autocorrelation function ACF (range: 0-1) proved to be a measure of how similar the texture is at a given distance from the original location. If this number fell rapidly to zero along a given direction, then the surface was different and thus "uncorrelated" with the original measurement location. The Auto-Correlation Length, $\beta$, was a measure of the distance over the surface such that the new location would have minimal correlation with the original location. Power spectrums obtained in this manner are also able to provide very useful texture information. The direction over the surface chosen to measure the $\beta$ was the direction which had the lowest $\beta$ value. The term $S_{tr}$ (0-1 for anisotropic to isotropic) was a measure of the spatial isotropy.

The word "lay" was also used in the metal machining literature to indicate surface anisotropy. Drill bits had been found to possess a high lay (anisotropy) at several levels of magnification. For lubricated contact conditions, there was additionally some friction that was developed at low sliding velocities which was influenced by stickiness and other hysteresis prone hydrodynamic conditions. The study of nano-tribological wear also became important to satisfy the new requirements for large data storage that require rapidly rotating discs.

R, or Ra, is the mean roughness, and $\lambda$ is the mean spatial length especially if the asperities can be defined by a Fourier function. For the three types of asperities commonly studied in the literature (drawn from the larger collection offered of the seven concave Euler polyhedral and their variations) there exists, at most, three conditions for the coefficient of friction; (i) when the surfaces are flat, i.e., the condition for high adhesive friction; (ii) the plastic deformation of conical type asperities, i.e., abrasive contact friction conditions; and (iii) the high wavelength spherical (wavy surfaces) contact.

Even for the measurements made on very clean surfaces, experiments indicated a much lower friction coefficient than was predicted. The discrepancy between predictions and experiments could have arisen from loose particles commonly resident on engineering surfaces, humidity, or reflect on the somewhat simplistic nature of the plastic deformation criterion considered in predictions, compounded with the difficulty in obtaining a correct value of $\tau$ due to the changing real surface area of contact with normal load. Some measurements also indicated that only an oscillatory coefficient of friction was ever-possible to obtain. This brought some focus towards the importance of the lateral waviness and its variations on texture, i.e., in addition to the simple amplitude and wavelength representation of a wavy surface. However, no key analysis was available or discovered concerning any critical texture dimensions. The plasticity indices for plastic interaction between the surface asperities were defined respectively for the adhesive regime of friction and more wear-based regime. In the present application it is shown for the first time that tuning of a surface is a process of changing the autocorrelation feature and or the RMS height feature, and that can be generally done by modifying at least one asperity.

The data points taken over time may have internal structure and lags. These could be autocorrelation, trends and seasonality. By seasonality, one means periodic fluctuations. This is not common in engineering surface data except for nanotexture. The autocorrelation plot or subseries plots (terms defined in the common literature) can detect seasonality. Seasonal subseries plots can be thought to be hierarchical nanostructures in a wavier feature described by seasonality. Autocorrelation plots show autocorrelation with lags. When β was the autocorrelation-length, a direct correlation, i.e., was inferred. Rougher and softer surfaces thus were revealed to have a higher plasticity index in the adhesive regime. A value of the plasticity index (~1) were reflective of a low percentage (~1%) of asperities that were elastically deformed. In the adhesive and plastic regimes, the plasticity index correlated well with the coefficient of friction. Most surface textures have not recognized the difference between seasonality and simple periodicities to dates, but it is discussed in this application that the lags and seasonality can dramatically affect properties in the nanoscale textured surface. Another way to think about this is a reorganization, self-organizing or self-assembly of the nanoscale structure. One may also infer an alternating sequence of positive and negative spikes that may not decay to the mean or zero, i.e., a Fourier decomposed sinusoidal type structure.

It has been suggested that the real area of contact is related to the square of the inverse of the plasticity coefficient and related on a log-log plot to the non-dimensional load. The relationship to the coefficient of friction is not explicitly called out, although clearly it is known that they have an inverse relationship in the plastic region and a proportion relationship in the adhesive region. The real area of contact captures the total interacting roughness, which is very difficult to measure under load. The shearing resistance force for friction is related to a combination of the yield strength and its anisotropy, bond strength and bond collapse of the asperity region. Friction also excites vibrations; thus, the area term can also encompass certain variation in the local normal forces that give rise to vibrational components from the "jumpiness" caused by asperities that move over the surface hills and valleys of the mating surfaces. In the classical friction literature of this period, only one surface is assumed to have asperities and the volume of interest is defined between an average plane of a rough surface and a smooth surface, therefore, for the most part, the friction analyses ignore vibration induced chatter. However, the interactions between friction and vibrations create sonic waves and are a way to assess the life of a component, e.g., a drill-bits near the end of life emit a higher frequency sound. A change in frequency thus can be an indicator of the change in the roughness. However, regardless of the nature of the sonic dB only a few Watts are normally lost in this manner. Only in nano-tribological applications does this factor become important enough to consider it from an energy perspective, but the energy loss from the thermal energy that is generated (reflected in the temperature rise of interacting surfaces) represents a high use of energy unless the coefficient of friction is low. The temperature rise represents significant energy dissipation from new entropy generating processes such as plastic deformation, microcracks, cleaving of work hardening, and bond releases and formation. Auto correlation, power spectrum density and various curvature features of the asperities, that are influenced by noise-like perturbations to the texture from synthesis methods or wear or secretions are fully recognized herein as being of utmost importance for manipulating tunability of friction and surface related properties. Texture of a surface may form from various influences and gradients of force in an analogous manner to what occurs for waves, where a gradient in height and the curvature driven surface tension gradient can be balanced with or without total wave movement.

SUMMARY

This application presents a quantifiable structure and method having deep implications for energy conservation. It is estimated (see e.g. reference K. Homberg and A. Erdemir, Friction 5(3): 263-284, ISSN 2223-7690, 2017) that ~23% of the world's total-energy consumption (greater than 575ExaJ/Y) (Exa=$10^{18}$), originates from tribological contacts. About 20% of this total energy (~114 EJ/Y), is used to overcome friction and ~3% (~17 EJ/Y) is used to remanufacture worn parts and spare equipment. Most friction pairs are estimated to be from contacts that are about 50% metallic. The targeted vision of the structure and system of this application is to offer over a 50% improvement to the large tribological sector. The benefits will mainly go towards operational savings from use of curved, planar and complex surfaces such as bearings and more complex-shaped units such as cutting-tools/drills type products, bearings, bushings, cookware, etc. Consumers generally like to pay a competitive price, have ease of maintenance or repair and continuously enhance their productivity or reach. Correspondingly, therefore, such advanced tribological technologies as proposed herein are estimated to reduce the harmful emissions during energy-production by as much as 1,460 Mt globally. Although the main benefit of this system is tied to the coefficient of friction and to the unique quasi-random (Quasi-R™) nanostructure-surfaces, the implications are strong in MQL (minimum quantity of lubricant), lower world energy use and high productivity by clean methods.

Several multivariate and single properties of a surface for an engineering application that are associated with a surface may be altered by the surface texture. For example, the coefficient of friction (μ), although not an intrinsic thermodynamic property of a material, is an extremely important surface engineering variable; one that encompasses fundamental material properties and surface texture. Depending on the objective of the application, the coefficient of friction addresses the energy requirement for an objective such as gripping or smooth-movement, as well as describes the critical conditions when slippage cannot be prevented. This or color or antimicrobial or photonic/plasmonic or interface heat transfer coefficient (heat flow) properties may be associated with texture aspects.

When a tight-grip is the objective, the friction-force is described by the static friction coefficient, $\mu_s$, which is equal to the frictional force divided by the normal force up to the onset of movement. Maintaining a steady grip or steady velocity often requires control, which is achieved in engineering and biological systems by altering the forces that are applied. These forces can be controlled by a variety of ways. Many live-systems, e.g. control enabled biological systems, use rapid feedback-mechanisms to alter the friction conditions, by altering the force, the surface texture and, additionally, by secreting combinations of various semisolids or fluids (synovial bursa mating surfaces). A growing amount of friction studies in convergent evolutionary tribology are now directed at the understanding of the optimization of evolutionary shape(s) for multivariate objective(s). Although the $\mu_s$ can take on any value even greater than one; for dry conditions, it is generally noted to be in the range of (0.02-1) for gripping, unless glues or welds are involved, which could make it higher. During dynamic-conditions, the $\mu_k$ (the subscript k denotes dynamic/kinetic conditions), is experimentally measured to be in the range of (0.08-0.35). It is proportional to the energy employed to maintain a velocity; the energy to perform the desired work; and is balanced for the energy expenditure required for stability and control. Invariably this then leads to a certain amount of wear.

The role of surface texture is very important for determining properties such as the coefficient of friction. There are many examples for the alteration of surface texture from materials processing and biological systems. Emphasis is given in this application to dry sliding conditions which are ecologically important compared to lubricated conditions in machining objectives. It should be noted, that wear, or friction may often have different objectives depending on the application. Also, texture and compounds influence photonic and plasmonic behavior and possibly the plasmonic and other band gaps.

DRAWINGS

DESCRIPTION

Figure 1:
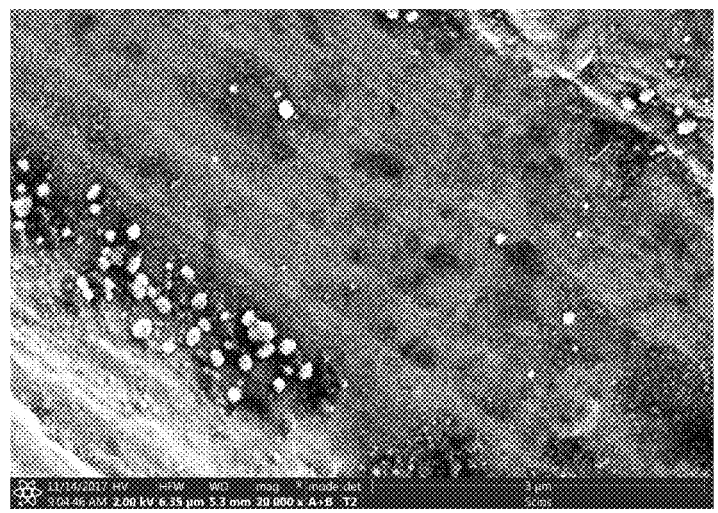
FIG. 1 shows anticipated asperities and asperities on asperities in a manner to control average autocorrelation and roughness features.

The index approach mentioned above has reasonable general validity. Recently, the index approach has been validated by more sophisticated multi-point contact type calculations as well as in biological systems. Today is the era of surface nano-materials development and open plasma system manufacture as well as open (restraint-free) stability analysis of the macro-system stability during a trajectory or process without the use of constraining guards or railings. This is also a period of bio-inspired development of surface texture at protein fibrillary and cell morphology levels. Adhesion is not just van der Waals forces but also comes from an ability of asperities to cause suction type forces. Bhushan et al. have shown that hierarchical nano-structures on micro-roughness features, gives rise to hydrophobic behavior. However, it appears that it a hydrophilic or medium contact angle behavior displays the lowest pull off forces. Nano-hierarchical structures are also possibly noted in ancient metallic mirror alloys in the Cu—Sn system. Hydrophobicity and wear are correlated in materials however, the reported data is from a limited number of studies and could be very specific to a specific assessment. Regardless, a low coefficient of friction is associated with peel-off food surfaces, but clearly not all aspects of $S_{tr}$ are fully understood especially for relationships between oleophilicity and texture. It has been reported that texture is more important to the release compared to the molecular bonding forces.

An important example stands out in modern cookware for non-stick without the use of PTFE being the use of open plasma showing the emergence of tunable hierarchical structures with development of stick resistant quick release food applications in cast irons to cell phone glass. It is possible that this is related to either a Wenzel state (fully lubricated asperity condition) as opposed to the Cassey-Baxter state that influences such behavior. The stick resistant feature is also correlated to the friction forces. Super frictionless machining with low β and low R in the nanoscale range has also been reported to provide vast improvements over PVD or CVD coated machine tool inserts and drills. Some microstructures may be produced on Ti-6Al-4V with open plasma processing methods where the surface friction tunability is achieved with a change in the processing-duration (in seconds) for controlling the β with a low R. Other examples are in multi-point and single point machine tools where chip friction and other contact friction forces are reduced. Also, surface finish and surface features, in general, are improved with the proper texture features and by considering the proper moments of the texture description. The deconvoluted Fourier transforms including for fibrils and the proper power spectrum is invoked here.

The concepts of friction and texture are being utilized even more in the evolutionary biology and evolutionary robotics literature. Nanoscale textured surfaces can influence friction forces and stability through sensors within about a millisecond feedback time to modify the texture, e.g., the tarsal attachment pads can provide an insect with information on the friction forces and to certain degree the type of debris on a surface. Note that a stick-slip feature is possible to produce for bristles that are flexible by bending, clustering or bunching. Several biological systems and internal combustion pistons deliberately use or encounter stick slip conditions. Balance and energy savings can be achieved with the correct texture as well as reduction in long term loss from wear, creep, viscoelastic loss, micro and macro pipe lossless and/or deformation and delamination and elimination or reduction of pitting from various causes including galvanic or other erosion. It is well recognized that texture, and curvature from texture, whether at asperities or from bending or junctions can be tuned to the most optimal, because gradients of charge and stress and forces can be controlled. Gradients cause entropy generation (total and density rate), i.e., loss.

The combination of the properties of the autocorrelation length β, the critical velocity $V_c$, which is based on the materials' wear characteristics, and the surface-compositing chemistry are noted to be important for the coefficient of friction. An innovative approach that considers a measurable quantity, namely the wear rate, as a key variable, may find application in the future to further improve the understanding of this subject-area. Interface structures can be simulated by solidification simulation, or Belousov-Zhabotinsky simulation, and deposition methods, particularly by hard materials such as diamond deposition. Some of the keys to better surface manufacture with a lower coefficient of friction appear to be techniques that promote nanostructure uniformity, such as open plasma processing methods. A need for better models that consider the velocity between the mating pairs, compared to just friction force method of assessments is required. More physical simulation methods for microstructure (including the wear debris), such as the transparent alloy solidification methods which can scale R and β across phase boundaries are required. Comparing friction models across mammalian membranes and industrials tools is expected to yield better understanding of multivariate objectives that include friction. Quick methods for measuring β, especially when in the nanometer range, e.g., for low-friction icosahedral quasicrystalline materials containing 4 nm particles are not yet developed except when using electron, X-ray and other microscopy methods. This is a key future development requirement, which can then possibly result in considerably better energy efficiency; longer lives of components from better wear resistant surfaces and better control of complex systems with existing feedback sensors. Correlation has shown that that the roughness parameters that are related to the shape of asperities of the profile, such as the β and Kurtosis, could have the strongest influence on the coefficient of friction, while the parameters related to the height of asperities of the profile, have the strongest influence on the wear. Regardless, one should also note that new texture description is also possible as an alternative to the texture parameters reported herein (namely to roughness and spatial features). It appears that texture and wear are more important for food-release in cooking-pans compared to columbic forces and for in anti-reflective solar cells. The texture and possibly friction appear to influence even stem cell features. Vibrotaction (small vibration feedback friction assessment) plays a significant role in texture discriminating mechanisms for stability. Thus, several properties that are related to texture including the friction properties may all be causally related, thereby making μ a very important number to determine.

DETAILED DESCRIPTION

It has been found that the surfaces and asperity types and profiles, as discussed above in the background and summary sections, may be obtained through the application and use of open plasma (thermal plasma) alone, and/or in combination with standard heating, multi-step conditioning or in combination with beams (laser, molecular, electron, quark beams etc.). Bacterial and electrochemical texture methods may be used as well. The above is merely a partial list of larger groups of contemplated and possible equivalent methods to produce such surfaces. The disclosed structure and method should not be limited by named methods.

Artificially creating a Gaussian-like random but uniform surface is normally a very costly undertaking, if at all feasible. Although random (in roughness feature distribution), such surfaces have much definable structure with useful periodic information contained in them that relate to engineering properties. The complete description however (e.g., that is required for friction tunability) of a surface is possible only by studying topographical functions and the higher moments. These functions include the autocorrelation function, the power spectral density function. It is recognized that often they are associated with a roughness R and an autocorrelation length β. Statistical and Fractal descriptions are interchangeable. Additionally, random surface structure can be associated with a 2-D power spectrum and excess entropy, also called Shannon or Tsallis entropy, for shape formation or to understand the self-organization behavior during wear processes. Almost all surfaces fall into a Gaussian autocorrelation description or an exponential autocorrelation description and are often referred to as being affine. Although Gaussian surfaces are isotropic, there is no directionality to the autocorrelation function and a certain degree of anisotropy is noted in many useful surfaces. All of these can be classified as Quasi-random surfaces with nano-scale-asperities. Because of the system presented in this application, surfaces may now be considered for photonic management in a variety of engineering applications such as highly efficient photon emittance from light-emitting diodes. Man-made Quasi R structures are very expensive to fabricate. Regardless, they are used in optics and electronics as polarizers, phase retarders, frequency-selective surfaces, and diffractive surfaces on a wide range of products. The applicants have discovered at least two important findings, namely that hard-Nano-asperities with the proper Hertzian modulus can lead to unanticipated friction-benefits in most metal pairs and an air-plasma process can be used to create asperities of the Quasi R variety.

Rapid treatment interactions with the plasma have now been studied for a variety of metal alloys of iron, nickel, titanium and zirconium. These trials have mostly served to reinforce the fact that the plasma is indeed of ionic character. X Ray, XPS coupled with high resolution SEM confirm the nitride and nitrogen-carbon containing nano-asperities on bare surfaces. The typical surface was affected to a thickness range from a micron to about ten microns for a 30 second exposure. This amount is adequate for the long life, good tribological and antimicrobial properties (wear rates are typically 0.3 micron/year for common use surfaces). As will be recorded again below, the limited studies made on HSS drill-bits indicate a better life and a much lower heat production during drilling operations. As the beam interactions most often studied were with ionized air, an oxygen content was also expected and determined. This barrier was the next to be overcome since oxygen containing surfaces are not expected to be beneficial for tribological use. Nitrogen was found to be present. This can only happen with ionization. EDX (Energy Dispersive X-ray) and EDAX always indicated nitrogen. However, EDAX as a tool is always suspect because of the closeness of the nitrogen to the oxygen peak, and so extensive XPS analyses were also carried out.

XPS (X-Ray Photoelectron Spectroscopy) results showed very clearly that sp2 and sp3 type carbon-carbon bonds are noted in carbon containing iron alloys treated with the beams. C—N bonds at 285.5 ev in the XPS data were also observed in iron and nickel carbon containing alloys. The splitting of the main metal XPS peak for Zr also indicates oxynitrides to be a major component in the sub-surface for alloys. Oxynitrides are not widely known to be of value but the limited literature that exists on these compounds shows that $TiO_xN_y$, $FeO_xN_y$, and $ZrO_xN_y$ are very exciting compounds with high elastic modulus that also offer a wide range of medium to high hardness phases depending on the O and N stoichiometry. There appears to be a rapidly emerging interest in the use of oxynitrides for plasmonic material and solar use. Nitride and Oxynitride phases are observed. When a metallic surface is exposed to this beam, typically surface temperatures reach about 550° C. when there is no other radiation shield or insulation that is provided. When the object is removed from the beam path, it is common to cool in air. This additionally introduces some oxygen. Unlike Oxynitrides, most pure nitrides are easily prone to oxidation.

For the purposes of this application a plasma is described by a fluid with a separated electron and ion atom in a fluid form. This encompassed Cascade e-ion plasma flame (also called CleanElectricFlame®, RF plasma and all other transfer plasmas used in welding or coating or other such similar uses.

The contemplated rough surface, consisting of asperities, may be produced through the application of open or closed plasma (plasma generated under normal atmospheric conditions or low or high pressure) to a desired surface. Air or other gasses may be used to generate the open plasma. Such generation of plasma is known with those knowledgeable in the art. The application of the plasma produces asperities on the surface that provide specific and repeatable traits such as friction and hydrophobicity. Surfaces may be tuned to attain desired traits by the manipulation of the open plasma application (time, temperature, angle, gas type, velocity, etc.) leading to the necessary asperities and textures required for the desired result. The entire surface may be in the meter size or much smaller. The asperities (texture) features are of a much smaller size, ten micron to nanometer size. Auto correlation often offers a proper determination of the correct width, or wavelength or frequency of a surface over its entirety of the area of use specific to the property of interest. It is anticipated that nanoscale features, asperities and or phases may possess natural clustering (in a manner similar to other length scales for clustering, cell formations or banding in order to create very local order and disorder). Ergodicity, stationary states and other features that are normally seen in signals over a predefined frequency or wavelengths in the signal processing and noise literature are fully recognized as something that can occur for surface textures. These conditions are expected to particularly influence the interface heat transfer coefficient (all types solid-solid, solid-liquid and solid-gas).

Many trials have been made by the applicants which revealed that this type of thermal open plasma allowed (for the first time) the generation of nano structures with nanoscale surface asperities.

Ideas related to the importance and use of textures include: changes in the averaged autocorrelation distance, i.e., with a defined averaged $\beta$ are possibly very critical; and generation of a tunable texture (The differential of beta with time can be zero, positive or negative). In the text below the words nano are related to the asperity and other microstructural features. Issues like Hardness and Modulus encompass compressive strains and stresses and other material property modifiers. Hardness (H) is strain rate sensitive or often dependent the strain rate. This is particularly important in high velocity applications. In steel samples phase like Fe2N, Fe3NC and Fe2N and other compounds were easily identified by X-Ray analysis.

The main drivers for energy efficiency from the textures come from following observations:

The power density of the open plasma beam assuming only 0.1% ionization is $10^6$-$10^9$ W/m$^2$. This compares well with other open beams such as laser-beams. Open beams have the advantage of allowing rapid part introduction and change-out, a must for volume production.

The beam diameters can approach 240 mm (as opposed to laser beams ~5 mm width). The units work with standard 208-240V socket power. A latter table compares the price of processing a surface with classical plasma systems. The improvement is very significant.

The open plasma allows very useful surface reactions to occur in varied applications like bioenergy, steam production and catalysis.

The plasma generator allows inputs of almost all gases from air to other common plasma use gases like Nitrogen, Argon and Nitrogen-Hydrogen premixed gases.

Most importantly, this plasma treatment appears to be a method for creating very useful, nano-surface textures, which further allow extremely low coefficients of friction and antimicrobial efficacy. About 100 EJ (ExaJoules is $10^{18}$ J) of energy are lost every year in tribological/transportation and machining uses. When exposed to the open plasma, the Coefficient of Friction (COF) is reduced by almost 60% over conventionally coated surfaces or the original surface. The potential energy benefit is staggering—about 30 EJ per year, based on recent calculations.

Nano particles and grains are well known to display a variety of nano-bacterial properties. Metallic surface nano-textures also offer permanent antimicrobial efficacy. The loss from nosocomial and other disease is high and rising rapidly. The costs of microbial corrosion and health issues are easily estimated to be in the billions of dollars per year (sundry web estimates indicate about $20 Billion). The invention is also directed for such cost-effective efficacy for machine tools and stainless steel curved and flat surfaces.

Figure 2:
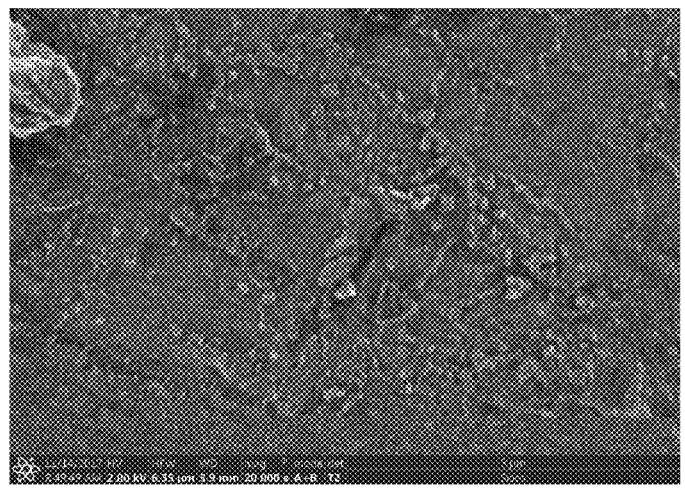
FIG. 2 shows anticipated asperities and asperities on asperities in a manner to control average autocorrelation and roughness features.
Figure 3:
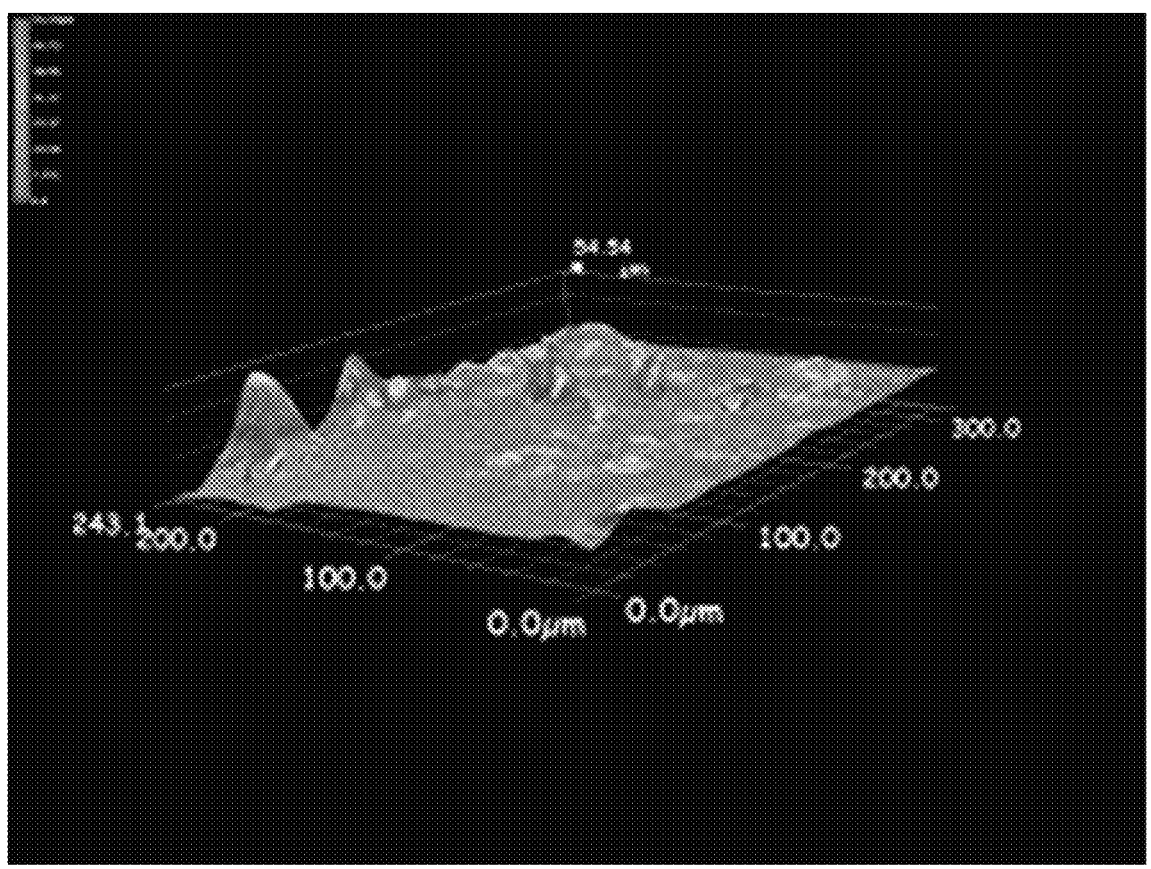
FIG. 3 illustrates surfaces comprising peaks and valleys having multi-asperity features.
Figure 4:
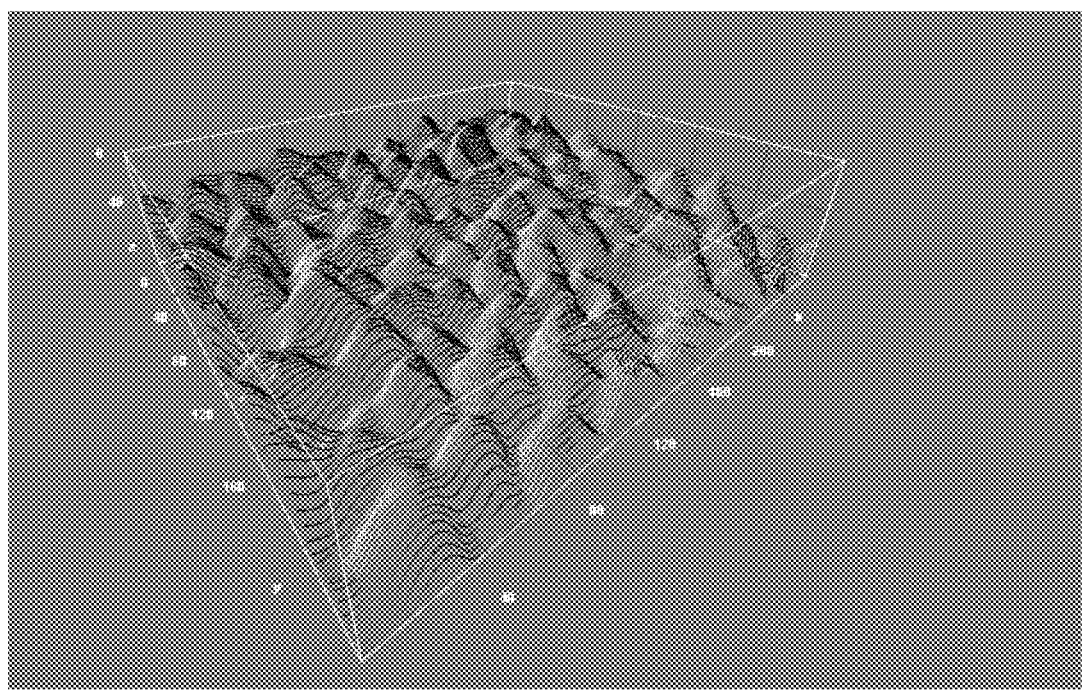
FIG. 4 illustrates surfaces comprising peaks and valleys having multi-asperity features.
Figure 5:
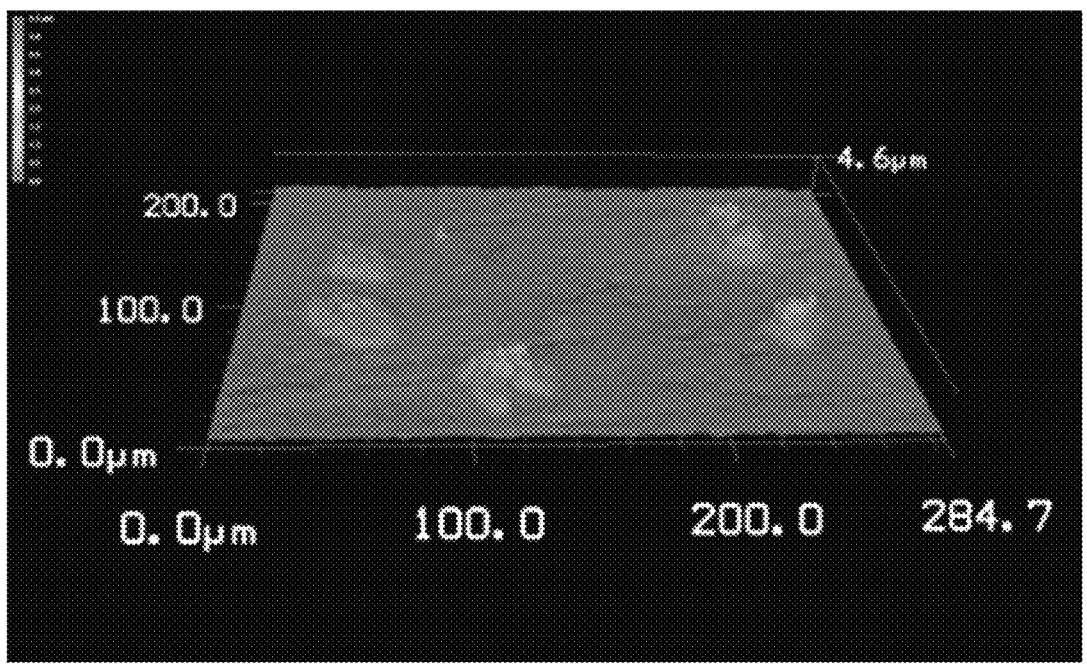
FIG. 5 illustrates surfaces comprising peaks and valleys having multi-asperity features.
Figure 6:
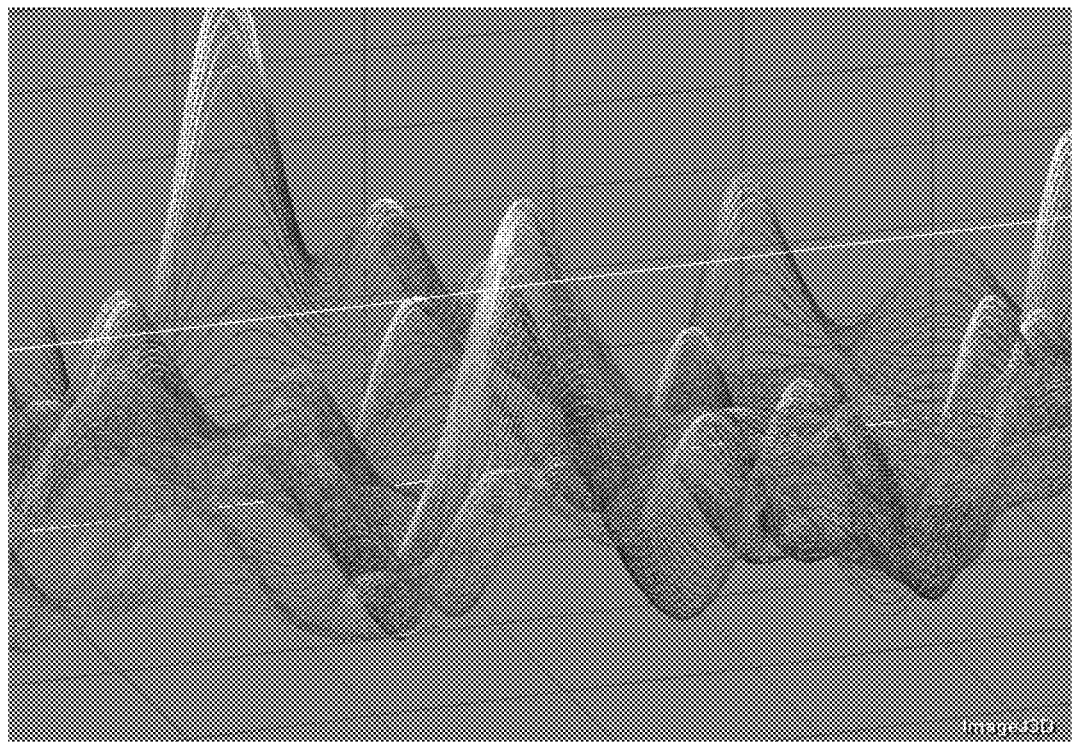
FIG. 6 illustrates surfaces comprising peaks and valleys having multi-asperity features.

FIGS. 1 and 2 illustrate composite surface textures, asperities on asperities in a manner to control the average autocorrelation with other roughness features in composites. Note how the placement of asperities on surface is anticipated. There can be bottom nano, or top nano or combinations across the surface width and height and different combinations of ceramics and metals. Nano features can be bottom or top asperities or combinations. FIGS. 1 and 2 also illustrate multiscale self-assembly of asperity or fibril features of a nanometer scale and micrometer scale size on an HSS (High Speed Steel) drill after modification of the surface texture by a cascade e-ion machine-based plasma treatment of the surface. Note the cellular like self-assembly and organizational behavior of perturbances and asperities.

Figure 7:
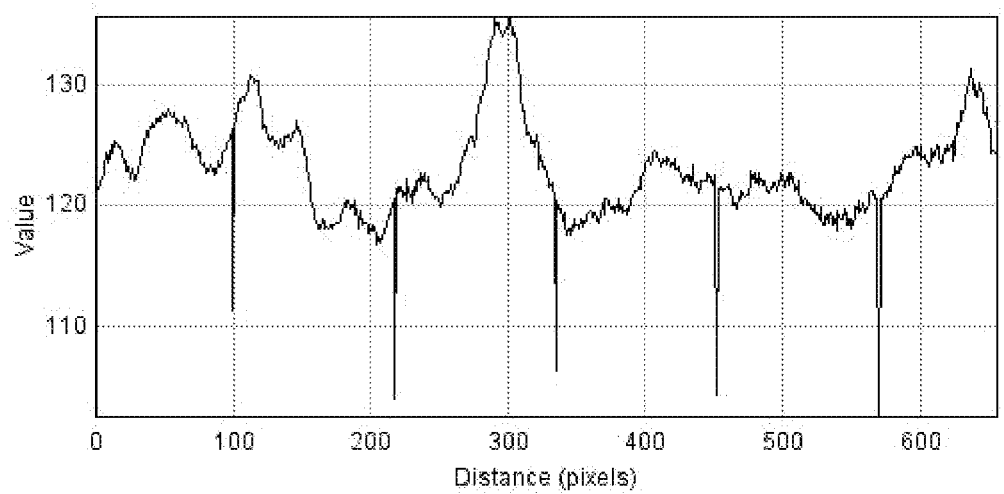
FIG. 7 is a dynamic plot highlighting kurtosis, hierarchical and skewness features present on the surface with varying tip radius and multiple dominant wavelengths/frequencies with changes in the wide stationary state or ergodic features.

It has been found that open plasma and combinations with standard heating multi step surface conditioning, or in combination with beams (laser molecular, electron, quark beams etc.) or bacterial texture or other methods can be used to make textures. FIGS. 3-6 show how peaks and valleys can have features (i.e. multi asperity features). FIG. 7 illustrates a dynamic plot highlighting kurtosis, hierarchical and skewness features present on the surface with varying tip radius and multiple dominant wavelengths or frequencies with changes in the wide stationary state or ergodic features. Similar assessments can be revealed by a power spectrum analysis.

Figure 8:
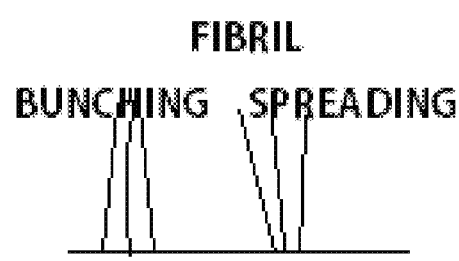
FIG. 8 illustrates asperity fibril bunching or spreading.

Asperity bunching, stability and hierarchical composite evolution of surface texture both in material composites and surface features are illustrated in FIG. 8. The asperities may be bunching or spreading at the surface.

Such manipulation for non-stick properties, low friction properties, interface heat transfer, catalysis, low wear properties etc. have been employed by the applicants. A surface can be made to become ergodic and wide sense stationary which will dramatically change properties. Seasonal periodicity removal over the area of interest can dramatically change properties including the color of a surface often making it bluer when observed in light for the correct type of Ra and $\beta$. This application of thermal plasma determines the best possible texture for the rate of entropy generation density.

Commercial applications of this surface texture modification are seen in the general machining, semiconductor, transportation, petroleum as well as in many common applications like cooking utensils. Depending on the texture feature it is easy to contemplate the addition and retention of solid or liquid lubricants to the surface.

The Influence of Texture on Color

It has become apparent that as pigments wear off surfaces during normal use, an increase in toxicity occurs in the environment. Such increase in toxicity is due to both particles of the abraded pigmented coatings and the necessity to recoat the surface. A possible solution is the use of asperities as a controller for coloration.

The natural color of metallic surfaces is grey metallic or, sometimes, yellowish. The reflection of light from a surface is either specular (mirror-like) or diffuse. Dispersion happens because of surface roughness. Reflection is caused in metals and alloys by the suppression of wave-propagation beyond very shallow skin depths k>0 where k is the imaginary part of the refractive index, n±ik.

The colors of metals, as commonly noted from reflected visible light, were never in the green or blue, until now. The applicants have observed blue metals which is unusual. As previously stated, most metals appear silver in color. Silver colored metals (such as silver or aluminum) do not absorb much or any of the visible light that hits them (incident light). Most of the light is reflected, which causes very little distortion in the color of the reflected light. For example, the spectrum of silver metal reveals that the incident light is almost 100% reflected, as apparent by the almost complete overlap of its incident and reflective light curves in the light intensity spectrum. Copper, on the other hand, has a distinctive red-orange color. The first and most obvious reason that any object is colored, is that the object absorbs some wavelengths of light and reflects other wavelengths of light. The light intensity spectrum of copper reveals that, when light is shined upon copper metal, the copper atoms absorb some of the light in the blue-green region of the spectrum where the incident and reflective light curves do not overlap as much as with the silver metal (Flinn Scientific, Inc., "Why Copper Is Reddish in Color", Publication No. 10307 061616, 2006).

When an object absorbs one color of light, its complementary color (as depicted on color wheels) is reflected to our eyes. Since blue-green light is absorbed, its complementary color, red-orange, is reflected. Hence copper appears a red-orange color.

Like copper, gold also lacks the typical "silvery" color of most metals. Instead it has a distinctive yellowish color. The light intensity spectrum of gold shows, less green light and a greater proportion of blue light is absorbed than with copper. This results in the reflection of the more orange-yellow complementary color and, therefore, gold is a more yellow-colored metal.

A Lambertian surface is an ideally diffuse surface where the surface radiance is the same when viewed from any angle of reflection. For such surfaces, the emission of the surface (equal to the absorptance) is the same regardless of the reflected (or viewing) angle. Several metallic surfaces are Lambertian and appear grey-like. Metals either are yellowish when they absorb the smaller wavelengths of white-light or they appear shiny grey (Lambertian). A high, positive, extinction coefficient enables reflection from shallow skin-depths.

The colors of a surface could be from the material (or pigment) that absorbs all but a few colors or from some other absorption phenomena. Unlike refraction, reflection does not commonly change colors (cause dispersion). However, for the first time, the applicants report a surface sometime also behaves like a diffraction grating for displaying rainbow-like reflections (e.g., drying colors seen after a water evaporation). Some metal heat-treatments, such as tempering, produce blue colors. Some butterflies also show unique blue hues for reflections from their wings. When CD ROMs were constructed with finer grooves (became DVD's) they tended to also reflect bluish hues.

The roughness of metals, of course, influences the specularly-reflected amount (reflectance) particularly at high angles of reflection because of the slope and shadowing effects of the roughness.

The human eye can perceive more variations in warmer colors than cooler ones. This is because almost ⅔ of the cones process the longer light wavelengths (reds, oranges and yellows). Nano features also reflect according to Fresnel and Snell laws of reflection thereby causing diffuse reflection. Generally, reflection and, or, diffraction is related to the plasma resonance frequency. Scattering is further affected by the surface texture as presented in this application.

The applicants submit that R/β (the second moment of a power spectrum of a gaussian surface/texture), influences the scattering behavior of any EM radiation and thus influences the intensity and perceived color of reflected light or surface. Reflection does not alter the speed or wavelength like refraction does. This second moment, or some variation of R/β, influences factors, such as, the coefficient of friction of metals, color, antimicrobial behavior and emissivity and reflection. The spread of the reflective waves is considerably changed by the texture when the average height of the asperities is lower than 400 nm. In such instances, an increase in R/β, increases the spread of reflection considerably.

Plasmonic and surface plasmon issues are affected by the asperities and R/β. This happens because the nano-curvature changes the resonant frequency of a curved surface (or on the surface) due to the presence of fine asperities. Colors and hues are affected by this. Information transfer by photon manipulation is significantly influenced by such nano-features and ratios. Gradients and curvatures in the nano-features and related surfaces are expected to influence the overall properties of the surface in unanticipated manners. Where the R/β especially when R and/or β are in the nano-range may be used to manipulate photon activity and related devices particularly by surface photon augmentation methods.

This application shows the influence on scattering and all reflection constants and many physical properties including the scattering, polarization, angular momentum, photons, magnons and other associated particles that can change by alteration of R/β. Note that metals do not show absorption peaks in the Golden-Red range so there is little possibility of inferring the obtaining of a blue metal. This is the first such application where manipulation of the electromagnetic wave is possible by the photonic surface device. Other contemplated applications are in the fields of communications, radar, anti-radar, satellites, electromagnetic, x-rays, sound spectra, entire light spectrum, GHz, kHz, and other reflective usages.

Although a wide variety and range of auto correlation lengths (β) and arithmetical mean roughness (Ra) may be generated by the application of open plasma and other means, it has been found that a solid (or hard) surface with asperities having an Ra<250 nm with Ra<200 nm with Ra<100 nm or Ra<50 nm and a β that is variable/possible between 1 nm and 1 mm is especially desirable for several single and multivariate properties like the coefficient of friction and related constraints. The applicants have found evidence to show that the Quasi R structures (for example exponentially autocorrelated) always will have an ACL lower than the Gaussian counterpart for the same RMS and thus invariably lead to a lower coefficient of friction for the use in regime beyond the critical velocity (like bearings and cutting tool uses). The Gaussian distribution has the maximum entropy among all distributions with the same RMS value. The difference between this maximum and the estimated is the entropy deficit. An engineered surface that has a texture with asperities arranged in a manner that the surface may be described by an autocorrelation length feature ($\beta$) and RMS R height and the ratio of R/$\beta$=0.0001 to 1000 is often best.

Contemplated embodiments may include: A texture of a surface which has no seasonality at a Nanometer-scale and micron-scale; A texture where the length scale of chaos is lower than 500 nm; A texture that offers the lowest entropy generation density rate in an application or observation; The length scale of the Lyapunov defined chaos is below 500 nm; A lag in the autocorrelation (correlogram) that is related to the velocity of sound or velocity of sound or velocity of movement of pairing surfaces such that there are only one or two relevant components; A surface with compositionally varying asperities having an Ra<100 nm and a $\beta$ that is variable between 1 nm and 1 mm; A surface which can be designed for up or down wear depending on the rate of change and sign of the rate of change of Ra and $\beta$ that are engineered with different tip densities of asperities at different heights from a mean plane; Surface asperities that are metallic to ceramic in character on the same surface (oxides, nitrides, oxynitrides, phosphides, silicides, carbides chlorides/fluorides, bromides, sulfides, carbon nitride, oxycarbides, all metals and alloys, carbonitrides and all chemical combinations of these); Surface asperity composites both chemical and hierarchical in iron based, and in combinations of oxides, nitrides, borides, silicides, carbides, carbo nitrides, oxycarbonitrides, with Fe, Mo, Si, Ta, W, Co, Ni and cast iron and Ti etc. (Such have been made and tested by the applicants with the open plasma (cascade) and the single electrode process.) Compositions may be stoichiometric or off stoichiometric; A surface containing (comprising) asperities of materials that support an electric charge gradient within and/or between asperities; A surface containing (comprising) asperities of materials that support an electric charge gradient within and/or between asperities; Hierarchical nanostructure surface with several dominant mean wavelengths or frequencies which define multivariate properties; Asperity or fibril bunching and stability and their variations across a surface; Clustering, self-assembly, cellular formations and/or other power spectrum defined ordering or disordering of asperities; and a growth, deposition or synthesis or time of wear method for manipulation the asperity texture features as reflected in the average power density spectrum and other autocorrelation features for the manipulation of surface properties. The applicants contend that this system will reduce waste friction energy in fluid flow against surfaces, solid friction, and many photonic applications. The applicants also submit that a method to improve stability of systems considerably has been discovered. This system and method will add to better autonomous vehicles, flight and water borne vehicles.

Further contemplated embodiments include the engineering of surfaces for: stability; low friction; photonic applications; plasmonic applications; sonic, sub-sonic and supersonic applications; color alteration for camouflage; surfaces that are affine (affine is used herein to mean very nearly isotropic); Random to Quasi Random™ and close to gaussian (including exponential ACF) surfaces; and surfaces having included or embodied solid or liquid lubricants.

The scientific study of friction appears to date to arguments made by Leonardo da Vinci (1452-1591), Leonhard Euler (1707-1783) and others. Two principles were fundamental to the analysis of friction. The first, which was called Amantons Law (a law based on empirical engineering understanding), offered a definition of the coefficient of friction, $\mu$, as related to the F (the friction force opposing the direction of movement (Equation 1)) normalized with the force Pn applied across the mating surfaces. Although the friction force was a reactionary surface-force, both F and P could be independently varied. The equation reflected the maximum F required for overcoming frictional resistance, with an increase in the normal force $P_a$ up to the release point (thus the real area of actual contact was unimportant). The second principle, which was sometimes attributed to Coulomb suggested that the sliding friction was a dynamic process with an interface bond structure which was independent of the sliding velocity. Thus, the coefficient of friction ($\mu$) achieved a constant value during the relative movement of a pair of surfaces. Both principles are captured by equation 1 below, subject to the friction release point(s) in the plot of F vs Pn (equation 1) after which slippage cannot be prevented with an increase in the normal force.

$$\mu = F/Pn \tag{1}$$

Equation 1 leads to a definition of the plastic indices (Equations 2 and 3, for $\Psi_a$ and $\Psi_p$) where $$\Psi_a = f(W,q) Z(E/H)(R/\beta) \tag{2}$$

$$\Psi_p = f(W) Z(E/H)(\sqrt{R}/\sqrt{\beta}) \tag{3}$$

These functions now may be thought of as relating to surface properties as is inferred below.

Here E is the Hertzian Elastic Modulus, i.e., of the asperity material or interface region of the solid-solid contact (GPa) (which accounts for the Poissons ratio of surface asperities) H is the Vickers type hardness (GPa) of the softer (more correctly the wearing surface), reflective of about three times the yield stress when it is a metal. The last terms (inside the square root) are the texture terms. R is an averaged measure of the height of asperity distribution above a centerline mean reference plane $\beta$ is the autocorrelation length related to the Autocorrelation function. The f(W,q) and f(W) are a functions of the specific wear, W and adhesive constants, (q) which are constants for a class of materials (see end note iii). Z is a constant for a mating pair, an asperity tip form-factor, that may range from about [4/$\pi$]f(g,d) for dynamic conditions to about 8/$\pi$(1+n). f(g,d), for static conditions where n is the Poisson's ratio of the asperity, g is the surface wavelength common to the area of interest and d is the width between the highest active asperities for the surface (particularly for fibrils or bristles where the mean-plane for measurement must be carefully calculated). The function f(g,d) is possibly also to related to the density and common curvature of the asperities in play. It should be noted that the ratio E/H is seen in other geometrical configurations that display an elastic-plastic transition with an increase in the applied load). This ratio is also representative of the ratio of the shearing resistance to the twist-yield-stress measured. An estimate of a realistic R/$\beta$ range is (0.005-1) and R/$\beta$ range is (0.02 to 1). The E/H term can vary from about 0.1-10000 depending on the mating pair. When the pairing is between the same materials, the E/H ratio is in the range of 1-20 for ceramic materials and 40-100 for metallic materials. Polymeric materials show a wide variation, e.g. for PEEK it is closer to 1 whereas epoxies and PTFE about 10-20. The common texture for PTFE gives R/β about 0.01 that places the index around 0.1.

The role of R/β for describing the texture is particularly important in solar materials where emissivity and absorptivity in the IR region of the spectrum of electromagnetic wavelengths is concerned. When a dimensional less parameter Z is prefixed to the R/β the Z is different for the surface property being optimized. A subscript for Z, as shown below, brings property specific information. The value of Z is dependent on the surface property being considered and the R/β is texture parameter. For Friction: Zf(R/β) is close to 1 for very high friction. (Here Z=E/H where E is the modulus and H is the hardness.) For Color: Zc(R/β) between 0.8 to 10 is particularly useful for color—Hue manipulations. For Wear: Zw(R/β) less than 0.3 or greater than about 3 is particularly useful for low wear.

One can extend the relationships described in Equations 2 and 3 by studying known experimental results from published studies of a wear-rate. The indices in Equation 3 may be considered in a differential form. dR/dt is equal to =−W pncV (W is the specific wear, t is time). Note that dR/dt~can be positive or negative depending on the wearing material and the asperity material that is considered with reference to the control plane. Note also that the roughness R is set by surface finishing processes or by secondary surface growth processes, whereas, β is mostly set by the materials processing conditions. The critical contact pressure for slippage prevention (in the face-normal direction) is pnc=tc/mc, and V is the velocity. For obtaining conditions of dΨ/dt=0, a condition for effective control, the beta must change in an appropriate manner. Equation 4 can then follow from equation 3 which implies that either more asperities of a smaller slope come into play, or that wear requires a reduction in b with the help of debris that influences the rate of change of ACL or other mechanisms for maintenance of the original texture ratio. Note that β is generally found to be in the range of 0.5 to 5 microns whereas R can be as low as 20 nm with the smooth surface finishing techniques available today. Note also that the wear-maximum is often found mid-point (~0.6), of the plasticity index change for semiconductor wafer polishing; somewhat akin to human skin wear. The conditions that give dΨ=dmk=0 (steady state), in the adhesive or plastic regime can be enabled by abrasives that are constantly added and removed, leading to a polished surface of the wearing mate but one that enables the correct sign of db for the wear loss. For tool asperity wear in machining dR/dt<0. With use, the tool will either develop high friction forces (and seize) or if this happens in the adhesive regime the tool will be unable to remove new material but will go on translating (slipping). Both conditions are noted in high and low speed machining respectively.

By using W, as a primary variable (Equation 4), porosity can be factored into the analysis. For example, a low porosity in a casting or a finer microstructure may lead to a higher hardness in the wearable material that effectively reduces the coefficient of friction (because Ψ in equation 3 will be lower for a higher hardness in this V~Vc regime for the low velocity of 0.07 m/s).

Note that the wear rate reaches a steady state for most friction objectives. The change in the β value with wear is significantly dominated by the value of W especially for hard materials. Thus, a high hardness material is commonly thought to be a low friction material, although by now the reader will understand the subtleties involved. Sometimes the shininess of a surface (low R) is associated with low friction. Equations 3 and 4 may be used to understand how the depletion of concentration of abrasives may influence wear and polish outcomes. A reduction in R with continued polishing can lead to a lower coefficient of friction. A polishing operation by an open feeding system of replenishing the polishing agent can lead to decreasing or increasing β or a steady state. Thus, one may begin to understand why sometimes in the adhesion range a better (shinier) polish will reduce friction or why bristles can lead to stick-slip conditions or why reversing the direction of travel (e.g. of a piston engine) can sometime increase wear volume (transition through stick-slip) and sometimes mitigate it. For the condition $$\frac{d\Psi}{dt} = 0, \qquad (4)$$
$$\frac{d\beta}{dt} = \frac{(dR/dt)\beta}{R} = -W\tau cV\beta/\mu R$$

One may substitute the plasticity indices for the texture ratio in Equation 4 and assess a relationship between μ and the indices. As μ is directly related to the temperature rise during rubbing type conditions, Equation 4 may be further extended and measured with a temperature measurement sensor. Experimental verification of Equation 4 is not always possible from the available data in the literature, however some checks can be made; e.g. for a fixed negative (db/dt)/β, an order of magnitude increase in velocity should correspondingly increase the coefficient of friction by a similar multiplier. This has been reported experimentally. A decrease in the coefficient of friction is also possible with velocity for certain polymeric surfaces, but it is not clear how W is influenced-a simultaneous decrease in W could cause such an effect. However, if the term (−db/dt)/β) should change with velocity, a higher velocity could offer a lower coefficient of friction as is commonly noted in metal machining studies. Although the claimed embodiments are specific to the auto-correlation, this application encompasses all forms such as gaussian or exponential and other variations that affect the power spectrum of surface textures.

Further, this application relates to a new class of 2D, fractal and 3D linked sub-molecules, and method for producing the same, that are effectively formed by ion treating a surface, and creating a sub-lattice level of strong molecules, made of a metal or composite and thereby a hard surface. These sub-lattices may be found below the tunable asperities and are produced by application of thermal plasma. Although metal substructures clearly do not possess long range bonds and can therefore be treated as a collection of lattices, it appears that under certain conditions, a sub-layered molecularly strong structure is possible under certain conditions making the surface smooth and resistant to sticking.

Thus, in this application a structure and method are introduced providing surfaces for stability, low friction, photonic use, color and camouflage, plasmonic behavior, microbial action and sonic, super-sonic and sub-sonic applications all of which may be tuned for the desired results.

I claim:

1. An engineered surface that has a texture with at least one asperity arranged in a manner such that the engineered surface is described by an autocorrelation length feature β and RMS R height wherein a ratio of R/β is between 0.001 and 1000 and wherein the engineered surface is designed for up or down wear depending on a rate of change and sign of the rate of change of mean roughness and the autocorrelation length feature β that are engineered with different tip densities of the at least one asperity at different heights from a mean plane.

2. The engineered surface of claim 1 that is affine.

3. The engineered surface of claim 1 wherein the at least one asperity is tuned by a controlled application of thermal plasma.

4. The engineered surface of claim 1 further comprising a second asperity that is different from the at least one asperity.

5. The engineered surface of claim 1 which has solid or liquid lubricants added or incorporated in it.

6. The engineered surface of claim 1 wherein the mean roughness is less than 50 nm.

7. The surface of claim 1 wherein the autocorrelation length feature β is between 1 nm and 1 mm.

8. An engineered surface that has a texture with compositionally varying asperities arranged in a manner such that the engineered surface is described by an autocorrelation length feature β and RMS R height wherein a ratio of R/β is between 0.001 and 1000 wherein the engineered surface has a mean roughness of 100 nm or less and the autocorrelation length feature β is variable between 1 nm and 1 mm.

9. The engineered surface of claim 1 wherein the at least one asperity is metallic or ceramic.

10. The engineered surface of claim 1 further comprising asperity composites that is chemical or hierarchical, or combinations of oxides, nitrides, borides, silicides, carbides, carbonitrides, oxycarbonitrides, with Fe, Al, Cu, Sn, Zn, Mo, Si, Ta, W, Co, Ni and cast iron and Ti and mixtures.

11. The engineered surface of claim 1 where the at least one asperity and a second asperity support an electric charge gradient within or between the at least one asperity and the second asperity.

12. The engineered surface of claim 1 further comprising hierarchical nanostructure surfaces with dominant mean wavelengths or frequencies which define multivariate properties.

13. An engineered surface that has a texture with at least one asperity arranged in a manner such that the engineered surface is described by an autocorrelation length feature β and RMS R height wherein a ratio of R/β is between 0.001 and 1000, and wherein the at least one asperity is comprised of fibril bunching or spreading.

14. The engineered surface of claim 1 wherein the at least one asperity is ordered or disordered by clustering, self-assembly or cellular formations.

15. The engineered surface of claim 8 wherein the at least one asperity is tuned by a controlled application of thermal plasma.

16. The engineered surface of claim 13 wherein the at least one asperity is tuned by a controlled application of thermal plasma.

* * * * *